United States Patent [19]
LaChapelle, Jr. et al.

[11] 4,086,375
[45] Apr. 25, 1978

[54] BATCH PROCESS PROVIDING BEAM LEADS FOR MICROELECTRONIC DEVICES HAVING METALLIZED CONTACT PADS

[75] Inventors: Theodore J. LaChapelle, Jr., Orange; John R. Davis, Costa Mesa; James J. Licari, Whittier, all of Calif.

[73] Assignee: Rockwell International Corporation, El Segundo, Calif.

[21] Appl. No.: 629,736

[22] Filed: Nov. 7, 1975

[51] Int. Cl.$^2$ .................. B05D 5/12; H01L 21/00
[52] U.S. Cl. .................... 427/90; 427/89; 427/91; 427/99; 427/124; 427/125; 156/645; 156/650; 156/656; 156/657; 29/578; 29/583; 29/576 R
[58] Field of Search ............... 156/3, 11, 13, 17, 18, 156/645, 650, 656, 657, 659, 662, 663, 664, 665, 667; 427/96, 124, 125, 99, 259, 266, 264, 265, 270, 271, 272, 282, 289, 404, 419 R, 419 A, 419 D, 419 E, 88–91; 204/23, 38 B; 29/578, 583, 589, 591

[56] References Cited
U.S. PATENT DOCUMENTS

| | | | |
|---|---|---|---|
| 3,461,537 | 8/1969 | Lotz | 29/583 |
| 3,550,261 | 12/1970 | Schroeder | 29/583 |
| 3,639,811 | 1/1972 | Schroeder | 357/69 |
| 3,653,999 | 4/1972 | Fuller | 156/650 |
| 3,699,010 | 10/1972 | Nash | 357/71 |
| 3,700,497 | 10/1972 | Epifano et al. | 156/17 |
| 3,783,056 | 1/1974 | Keller et al. | 156/3 |
| 3,890,177 | 6/1975 | Pfahnl et al. | 156/13 |
| 3,890,636 | 6/1975 | Harada et al. | 357/69 |
| 3,925,880 | 12/1975 | Rosvold | 29/591 |

Primary Examiner—John T. Goolkasian
Attorney, Agent, or Firm—H. Fredrick Hamann; G. Donald Weber, Jr.; Gilbert H. Friedman

[57] ABSTRACT

A monometallic batch process for forming beam leads of a preferred metal such as aluminum or gold. The process is applied to a wafer of finished microelectronic devices already having metal contact pads of the same preferred metal. Where aluminum is the desired metal, high deposition rates are used to minimize aluminum oxide contamination. High yield is achieved by forming the beam leads to have an elevated cantilevered configuration, by deep scribing of the wafer and, when desired, by providing an energy absorbing cushion to reduce the effect of collisions between chip edges and beam leads.

12 Claims, 11 Drawing Figures

BATCH PROCESS PROVIDING BEAM LEADS FOR MICROELECTRONIC DEVICES HAVING METALLIZED CONTACT PADS

The invention herein described was made in the course of or under a contract or subcontract thereunder with the United States Army.

BACKGROUND OF THE INVENTION

1. Field of the Invention

The present invention relates to processes for forming beam-leaded microelectronic chip structures and, more particularly, to batch processes wherein a plurality of interdigitated beam leads of a preferred metal such as aluminum or gold are formed simultaneously on a wafer or substrate comprising a plurality of pre-fabricated microelectronic devices, each such device having pre-fabricated metallized contact pads of substantially the same preferred metal as is used to form the beam leads.

2. Description of the Prior Art

Batch processes for providing microelectronic circuits and similar devices with beam leads have been practiced for a significant period of time. Most such devices use aluminum metallization internally. However, for the relatively thick metallic films required to be deposited for beam leads, vacuum deposition techniques heretofore used for aluminum have not been satisfactory. For example, the deposition techniques have been relatively slow thereby permitting aluminum oxide to contaminate the aluminum. The aluminum is thereby caused to be relatively brittle and to have relatively high resistivity. On the other hand, high purity gold having good physical and electrical characteristics, as well as high resistance to corrosion, can be deposited to any desired thickness by electroplating. For this reason, gold has been the desired metallization for forming beam leads by batch processing.

However, gold beam leads should not be formed to have a direct interface with aluminum metallization. By reason of interdiffusion of these two metals, intermetallic compounds which are both brittle and highly resistive will evantually form and the integrity of such an interface will be degraded or destroyed. To avoid using gold directly on aluminum, the common practice has been to form indirect connections from the semiconductor regions of, for example, bipolar transistors within the device to gold beam leads through composites or laminates which are free of aluminum. One layer of the composite provides a relatively stable low-resistance ohmic contact adhering to the semiconductor material while another layer of a barrier material, e.g., platinum, affixes the gold while preventing the formation of deleterious interdiffusion products. While some manufacturers have successfully produced bipolar devices, for example, with such processes, the use therein of *rf* sputtering techniques for depositing one or more of the layers for the composite renders these processes undesirable for use with MOS devices. The radiation commonly generated by *rf* sputtering tends to adversely affect the characteristics of the latter type of circuitry.

There remains a need for a high-yield batch process for affixing beam leads to microelectronic devices which is relatively simple to practice effectively for a variety of circuitry.

SUMMARY OF THE INVENTION

The subject invention is a batch process for forming beam leads on microelectronic devices wherein the devices on a wafer are first finished and provided with contact pads of a preferred metal prior to using the subject invention. In practicing the subject invention, if the metal of the contact pads is gold, for example, the beam leads are then formed of gold also, primarily by electroplating. On the other hand, if the metal of the contact pads is aluminum, for example, the beam leads are then formed of aluminum also. In the latter case, a relatively fast vacuum evaporation technique is used to produce aluminum deposits essentially free of aluminum oxide. Thus the subject invention produces an essentially monometallic structure for the combination of contact pads and beam leads. To enhance the yields at the critical steps of breaking apart the wafer on which the individual microelectronic devices are formed and separating the resultant discrete chips, the process employs a removable in-contact release mask to elevate a portion of the beam leads over the surface of the wafer in a cantilevered configuration. This tends to prevent contact with and seizure of the beam leads during the aforementioned critical steps. To reduce the forces required to break the wafer, and thereby reduce chip displacement when fracture occurs, the water is first scribed through about 90 to 95% of its thickness. Where the force required to break the wafer into chips is still likely to be relatively large, one embodiment of the subject invention provides an energy absorbing cushion of polymerized resin or other flexible organic material deposited on the wafer in regions where contact between chip edges and beam leads is likely to occur.

The method of the subject invention is suitable for use with MOS, CMOS, charge transfer devices and other semiconductor devices or integrated circuitry and the like including purely passive devices.

BRIEF DESCRIPTION OF THE DRAWINGS

The foregoing and other features of the present invention will be more readily apparent from the drawings and the detailed description which follows. Corresponding reference numerals identify corresponding elements and parts throughout the several figures.

DESCRIPTION OF THE PREFERRED EMBODIMENTS

Figure 1:
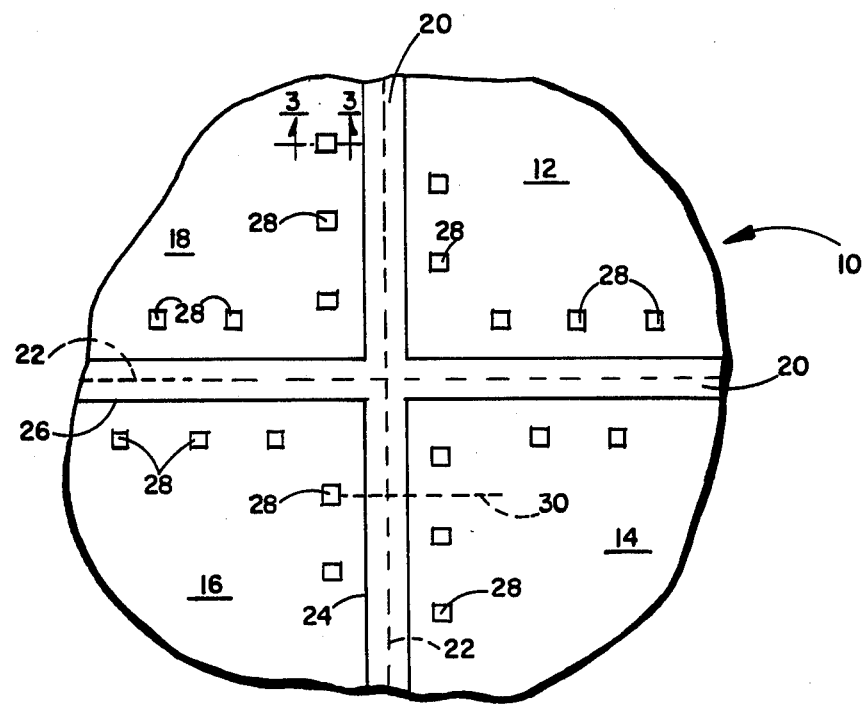
FIG. 1 is a top view of a portion of a substrate, semiconductor wafer or the like having a plurality of microelectronic circuits fabricated thereon showing the relative placement of metallized contact pads for the circuits on adjacent dice.

Attention is directed to FIG. 1 which shows a portion of a semiconductor wafer 10 on which there has been fabricated a plurality of microelectronic circuits or devices by appropriate integrated circuit fabrication techniques. Portions of four individual microelectronic circuit dice 12, 14, 16 and 18 are shown adjacent each other in FIG. 1. Each circuit die is spaced apart from its neighbors on the wafer 10 by streets 20 on which no usable circuitry is fabricated. The streets 20 are reserved for eventual scribing and breaking apart of the dice (nominally along dashed lines 22) to form discrete microelectronic circuit chips. The boundaries of the streets 20 are the edges of the microelectronic circuit dice as, for example, the edges 24 and 26 of microelectronic circuit die 16.

Each microelectronic circuit on the wafer 10 is provided with a plurality of metallized contact pads 28 spaced apart from each other and preferably positioned relatively close to an edge of the microelectronic circuit die. The contact pads 28 are interconnected (not shown) within the microelectronic circuit, as appropriate, for the provision of power to the circuit, for the input and output of signals, and for such other functions as may be required.

It should be noted that, for convenience, some of the detailed description which follows uses the example of MOS circuitry fabricated on a semiconductor (usually silicon) wafer 10 to illustrate the use of the instant invention. However, the invention is not so limited. The invention can be practiced on any type of device which is, or can be, prefabricated up to the point where a plurality of individual dice on a wafer or substrate are provided with metallized contact pads 28 substantially as shown in FIG. 1. This includes MOS circuitry fabricated using silicon deposited on sapphire, bipolar circuitry, charge transfer devices, resistors and resistor arrays, capacitors and capacitor arrays and special purpose devices as, for example, bubble memories.

For efficient use of the available semiconductor area on a wafer 10 to be processed in accordance with the instant invention, it is often considered desirable that each of the metallized contact pads 28 be positioned so that it is offset from the next closest contact pads 28 on an adjacent die. This is illustrated in FIG. 1 wherein dashed line 30 is shown extending from a contact pad 28 on microelectronic circuit die 16 perpendicular to the die edge 24 and across a street 20 onto microelectronic circuit die 14. It is apparent that dashed line 30 is spaced apart from, and therefore offset from, the two next closest contact pads 28 on die 14.

Figure 2:
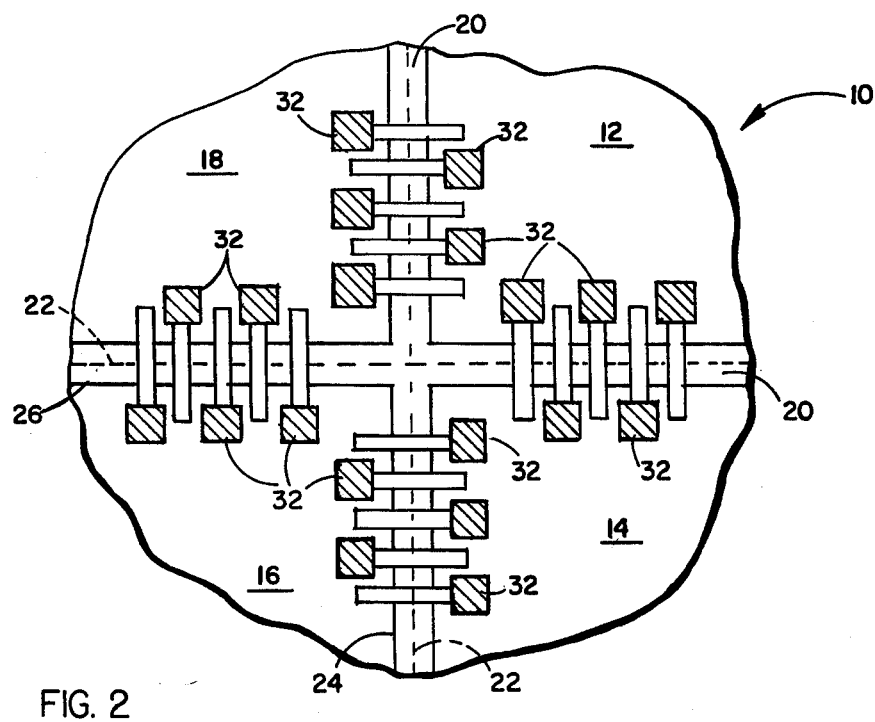
FIG. 2 is a top view of the same portion of a substrate, semiconductor wafer or the like shown in FIG. 1 after having interdigitated beam leads formed thereon in accordance with the present invention.

FIG. 2 shows the same semiconductor wafer 10 as shown in FIG. 1 after processing in accordance with the instant invention to affix beam leads 32 to the contact pads (see FIG. 1) thereof including those on the microelectronic circuit dice 12, 14, 16 and 18. A typical width for the streets 20 is about four mils. A suitable length for a beam lead 32 is one which gives it, for example, an overhang of about seven mils beyond the edge of the die to which it is connected. Thus, it is apparent that a beam lead fabricated in accordance with this described embodiment and affixed to a contact pad 28 on one die will extend about three mils over an adjacent die. This is accomplished most conveniently if beam leads 32 affixed along parallel edges of adjacent die are interdigitated as shown in FIG. 2. It is for this reason that the metallized contact pads 28 (FIG. 1) on adjacent dice are usually offset from each other.

FIG. 2 is a diagrammatic representation of the wafer 10 as it appears after beam leads are fabricated thereon but before the individual microelectronic circuit dice are separated into discrete beam-leaded chips. That portion of each beam lead 32 which is shaded in FIG. 2 is over a region wherein the beam lead 32 is affixed to, and in electrical contact with, a contact pad 28 (FIG. 1). The remaining portion of each beam lead 32 is spaced above and cantilevered out over the wafer 10.

Figure 3A:
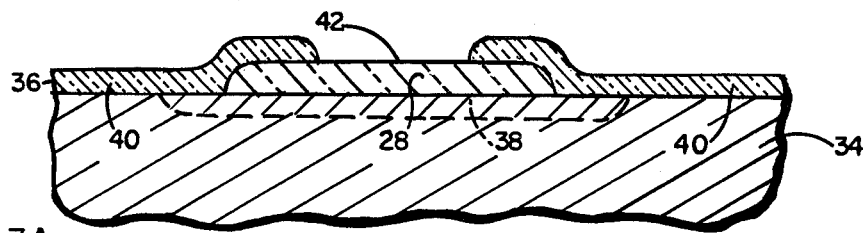
FIGS. 3A-3E are schematic process diagrams showing, in sectional views, the steps of producing cantilevered beam leads on the microelectronic circuit dice of a wafer.

FIGS. 3A to 3E are schematic sectional views showing the process steps of fabricating cantilevered beam leads for microelectronic circuit dice on a wafer or substrate such as the wafer 10 of FIG. 1. The initial structure is shown in FIG. 3A which is a cross-sectional view of a small portion of the wafer 10 of FIG. 1 looking in the direction of the arrows 3—3 of FIG. 1. It should be noted that this initial structure is a fully fabricated microelectronic circuit. That is to say, if the wafer 10, as shown in FIG. 3A, were diced and separated into discrete chips, these chips could then be interconnected into a utilization system by a standard technique such as thermocompression or ultrasonic wire bonding to the contact pads 28. The chips would then be operational without further special processing.

FIG. 3A shows a substrate 34 which may be, for example, a portion of a silicon wafer in which both active and passive circuit elements have been pre-fabricated. These circuit elements conventionally take the form of semiconductor regions of different conductivity type. For convenience of illustration, the details of these circuit elements are not shown. On the top surface 36 of the substrate 34 is one of the metallized contact pads 28 previously discussed in connection with FIG. 1. The metallized contact pads 28 are in contact with regions 38 of the substrate 34.

If the circuitry in the substrate 34 is, for example, MOS circuitry, a particular region 38 may be the semiconductor material of a source electrode, a drain electrode or the body of a field effect transistor. A region 38 may also be a layer of silicon oxide over a gate electrode for a field effect transistor or a portion of the metallization used for interconnecting the various MOS circuit elements of the substrate 34. The preferred metal for interconnections within MOS circuitry is aluminum to which there is sometimes added a few percent of copper to limit migration of the metallization. In each of the above examples given for the character of the region 38, the preferred metal for the contact pads 28 is also aluminum. As is well-known, aluminum forms low resistivity stable ohmic contacts with semiconductor material. Aluminum provides stable adherent electrodes on silicon oxide and, obviously, aluminum contact pads 28 are compatible with aluminum circuit metallization in the regions 38.

If the circuitry in the substrate 34 is, for example, bipolar circuitry, the regions 38 may be the semiconductor material of a collector, an emitter or a base of a bipolar transistor. Here again, for the reasons given above, the preferred metal for the contact pads 28 is aluminum.

However, for some types of circuitry, such as is used in charge transfer devices, gold is a preferred material for metallization interconnecting various active and passive elements within the substrate 34. Where this is the case, the regions 38 are portions of this gold metallization and the contact pads 28 are made of gold also as a compatible continuation of that metallization.

Also shown in FIG. 3A covering the top surface 36 of the substrate 34 is a layer of protective material 40. This protective material 40 extends over a portion of the contact pads 28 at the edges thereof leaving contact pad windows 42 exposed for external connection. The layer of protective material 40 may be a single layer of glass or silicon oxide to provide electrical insulation, protection from moisture and other foreign matter, and to provide protection from structural damage due to handling. A layer of silicon oxide or glass is regarded as providing sufficient protection for many types of circuitry such as, for example, bipolar circuitry. However, for MOS circuitry and any other class of devices which are known to be particularly susceptible to degradation due to contamination, it is preferable that the protective layer 40 be a composite having an inner layer of silicon oxide (e.g., silox) and an outer passivating layer of, for example, silicon nitride. For convenience, a representation of the boundary between an inner layer and an outer layer in a composite protective layer 40 is omitted in FIG. 3A. The protective layer 40 should be of relatively good quality, that is, relatively free of pin holes and other defects which, if present, would permit the etching solutions and solvents used in practicing the subject invention to penetrate to and contaminate the substrate 34 or attack the device metallization.

Figure 3B:
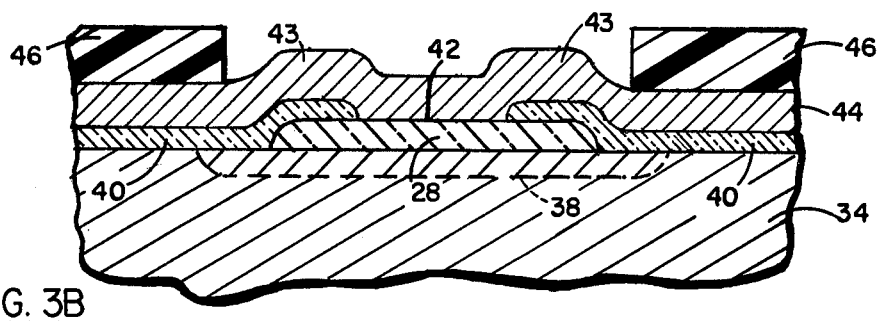

With reference to FIGS. 3B-3E, there will now be described the method of forming beam leads on the wafer 10 of FIG. 1 in accordance with the present invention. First, as shown in FIG. 3B, an in-contact release mask 44 of a removable release material is deposited over the entire wafer. A suitable material for this purpose is one which is readily deposited by a method which is not harmful to the devices, which remains stable during processing, and which is readily removed by a method which is not deleterious to either the devices, the contact pads, or to beam lead material subsequently deposited. In addition, this material should not itself be harmful to the devices. For example, it should not be a source of contamination. The in-contact release mask 44 is preferably of a metal such as copper, magnesium, zinc or titanium which is soluble in standard semiconductor processing etching solutions which do not readily dissolve the preferred metallization of the contact pads 28, viz, aluminum or gold. In the preferred embodiment of this invention, the in-contact release mask 44 is a layer of high-purity copper deposited on the wafer by standard evaporation techniques in a vacuum chamber having a pressure preferably no greater than about $10^{-5}$ torr. The wafer is preferably heated to about 200° C prior to the start of copper evaporation to insure good adhesion and is maintained at that temperature during deposition.

The in-contact release mask 44 is deposited to have a thickness of at least about 1 micron. A greater thickness, perhaps about two microns or more would be preferable provided the mask 44 is not made too thick for reasonable uniformity of thickness and adequate step edge coverage in the subsequent deposition of beam lead material as discussed hereinafter in connection with FIG. 3D.

Next, the regions of the in-contact release mask 44 immediately above the contact pad windows 42 and a rim 43 or border of the protective material 40 about one mil wide surrounding the contact pad windows 42 are photolithographically delineated and removed by etching. Standard photolithographic techniques, as commonly practiced in the semiconductor industry, are used for this purpose. In FIG. 3B, there is shown a deposited layer of photoresist 46 which has been developed to form an etch resistant photomask everywhere on the wafer except over the contact pad windows 42 and the rims 43 of protective material 40.

Figure 3C:
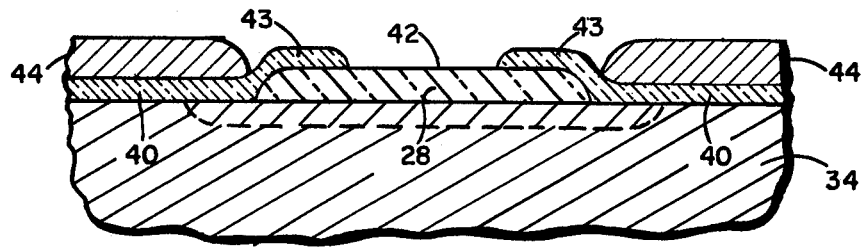

FIG. 3C shows a contact pad window 42 and rim 43 exposed after the in-contact release mask 44 has been etched away from the delineated region and the photoresist layer 46 (FIG. 3B) has been removed by a standard photoresist stripping solution. Where the contact pads 28 are of aluminum or gold and the mask 44 is of copper, the copper etchant is preferably nitric acid having some nitrite ion added thereto to provide a uniform etching rate.

Figure 3D:
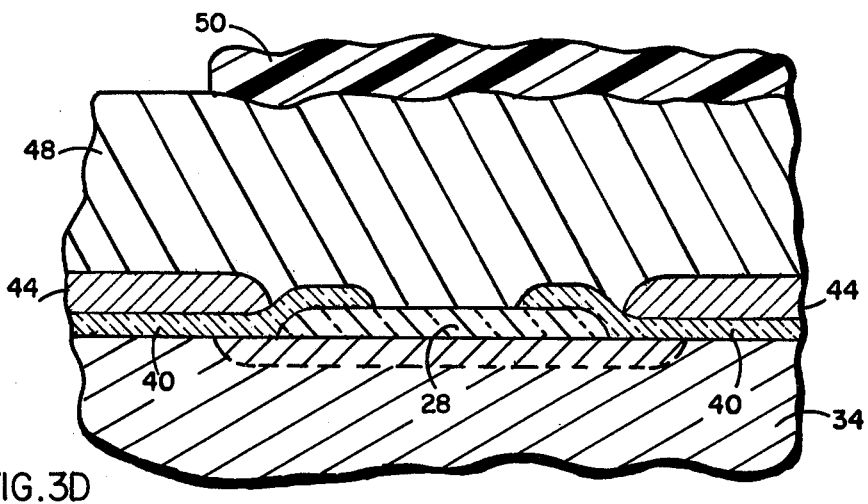

After the in-contact release mask 44 has been removed from the contact pad windows 42 and surrounding rims 43, a relatively thick layer of beam lead material 48 is deposited over the entire wafer as shown in FIG. 3D. The layer 48 is preferably about ten to twelve microns thick. When the contact pads 28 are of aluminum, the layer of beam lead material 48 is also of aluminum deposited by evaporation in a vacuum chamber wherein the pressure is preferably no greater than about $10^{-5}$ torr. It is also preferred that the aluminum be deposited at a relatively fast deposition rate, i.e., a rate which insures that the aluminum deposited on the wafer will be essentially free of aluminum oxide. Aluminum oxide reduces the bondability of beam leads by decreasing their softness and ductility. In addition, aluminum oxide increases the resistivity of aluminum. At a pressure of about $10^{-5}$ torr, the deposition rate should be on the order of 20,000 to 50,000 angstroms per minute. At lower pressures, somewhat slower deposition rates may be used. To produce a beam lead material having somewhat greater strength than pure aluminum, the deposited aluminum may be a dilute alloy with, for example, a concentration of about 1% of magnesium or silicon included therein.

In the preferred embodiment of this invention, the aluminum (or dilute aluminum alloy) is evaporated from a high capacity evaporation source. An example of such a source is an assembly comprising an rf induction heating coil surrounding a sizeable crucible of boron nitride. The molten aluminum in the crucible should have a surface area of about 10 cm$^2$ or more. The rate of evaporation of aluminum from the crucible and corresponding rate of deposition is controlled by controlling the electrical power supplied to the rf induction heating coil.

Here again, for good adhesion of the deposited aluminum, the wafer is preferably heated to about 200° C prior to the start of aluminum evaporation and is maintained at that temperature during deposition.

Where the contact pads 28 are of gold, the layer of beam lead material 48 is preferably deposited in two distinct steps. First, a thin layer of gold, on the order of from 2000 to 4000 angstroms in thickness, is deposited over the entire wafer by standard vacuum chamber evaporating techniques. This provides an electrode and a good metallic seal for the contact pad windows 42 and their surrounding rims 43 of protective material 40. The remainder of the relatively thick layer of beam lead material 48 of gold then is deposited, preferably by electroplating.

After the layer of beam lead material 48 is deposited, standard photolithographic techniques as commonly practiced in the semiconductor industry are used to delineate the individual beam leads 32 as shown in FIG. 2. In FIG. 3D, there is shown photoresist mask 50 which has been developed in typical fashion. Mask 50 defines the portions of the layer of beam lead material 48 which are to remain as the beam leads 32 after etching. The delineation of the beam leads 32 is then completed by etching away the unmasked portions of beam lead material 48. Where the beam lead material is aluminum, a standard phosphoric acid etchant suitable for use in semiconductor processing may be used. Where the beam lead material is gold, a standard tri-iodide etchant solution suitable for use in semiconductor processing may be used.

The remainder of the in-contact release mask 44 is then etched away by an etchant which does not significantly attack the beam lead material. Where the in-contact release mask is of copper, the etchant may be the same nitric acid etchant commonly used in semiconductor processing as was used to remove those portions of the release mask 44 which originally covered the contact pad windows 42 as shown in FIG. 3B. Subsequently, the photoresist mask 50 is removed by a standard photoresist stripping solution.

Figure 3E:
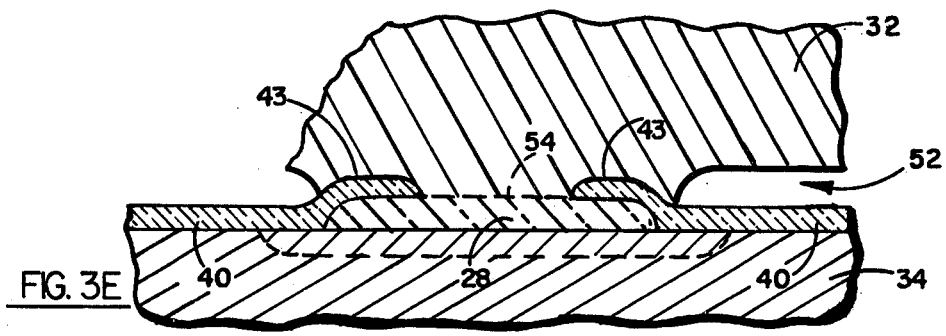

At this point in practicing the subject invention, the appearance of the microelectronic circuit structure is as shown in FIG. 3E which is a partial cross-sectional view taken longitudinally along any of the beam leads 32 shown in FIG. 2. The beam leads 32 are elevated above the surface of the wafer in the region 52. On the other hand, the beam leads 32 are firmly adherent to the contact pads 28 at interface 54 and to a portion of the protective layer 40 in the small rims 43 around their interfaces 54 with the contact pads 28. This extension of the adherent portion of the beam leads 32 to a portion of the protective layer 40, i.e., beyond the precise boundaries of the interface 54, provides additional sealing from contamination of the circuit elements in the substrate 34.

While is may not always be necessary, the strength of the bond between the beam leads 32 and the contact pads 28 may be enhanced and the electrical resistivity decreased at their interface 54 by next sintering the wafer. This may be done, for example, in a tube furnace having a flowing atmosphere of nitrogen or argon for about 30 minutes at 350° C. The interface 54 has been drawn in FIG. 3E as a dashed line to represent the interdiffusion of the original metallization of the contact pads 28 with the subsequent metallization of the beam leads 32 which results from sintering.

A critical step in the batch fabrication of beam-leaded microelectronic circuits is the scribing, or dicing, and then separation of the wafer into discrete beam-leaded ships. The criticality results from the practical necessity to minimize spoilage by reason of, among other things, breakage of or other damage to the fragile beam leads. Because the beam leads 32 extend over the streets 20 between the individual microelectronic circuits as shown in FIG. 2, the dicing must be executed on the reverse side of the wafer 10. In the preferred embodiment of this invention, the wafer 10 is diced, on said reverse side, nominally along the lines 22 in the middle of the streets 20 of FIG. 2. A precision, automatic-indexing, micro-dicing saw, well-known to those skilled in the art, may be used for this purpose. To minimize the force needed subsequently to break the wafer into discrete chips, the preferred depth of scribing is on the order of 90% to 95% of the thickness of the wafer. For example, silicon wafers are commonly about ten mils thick. For such a wafer, the preferred depth of scribing is 9.0 to 9.5 mils. The abovementioned type of precision saw is capable of being controlled for cutting to a desired depth with tolerances which are typically on the order of ±0.3 mil and is therefore suitable for this purpose. Laser scribing equipment which is controllable to equivalent tolerances may also be used. The precision is required to minimize the risk of cutting entirely through the wafer and consequently destroying beam leads.

After the step of scribing, the semiconductor wafer is broken into discrete chips. Breaking techniques are well known to those skilled in the art. In one embodiment, the wafer is placed between two relatively flexible sheets of plastic on a flat table. A cylindrical roller is then gently rolled over the outer sheet of plastic (adjacent the reverse or scribed side of the wafer). The force should be limited as closely as possible to only as much as is needed to break the substrate. The sheet of plastic adjacent the scribed side of the wafer may be of a thermoplastic material to which the wafer is lightly bonded by the application of heat. The discrete microelectronic circuit chips may then be physically displaced from each other, after the breaking step, by stretching the sheet of thermoplastic material. This technique is also well known to those skilled in the art.

It is apparent that the subject invention is an inherently high-yield process for batch fabricating beam leads on microelectronic circuits for two reasons. First, since the wafer is scribed almost entirely through its thickness the magnitude of the forces required to effect breaking into discrete chips is minimized. This reduces the risk of collision between beam leads and broken wafer edges when fracture of the wafer occurs. Second, since the extended portions of the beam leads have a released, or cantilevered, configuration, i.e., elevated over the wafer, stresses applied to the beam leads by reason of seizure with or scraping against the surface of the wafer tend to be eliminated both during the steps of breaking and subsequent chip separation.

While the invention thus far described is a high-yield process, particularly for microelectronic circuitry fabricated on silicon wafers or the like, it may be desirable to modify the process when relatively large forces are required to fracture the wafer during the breaking step. For example, when devices are fabricated in a layer of silicon deposited on sapphire, such relatively large forces may be required even when the depth of scribing on the order of 90 to 95% as discussed above. The danger is that, at the moment of fracture, the applied force may cause displacement of a chip causing an edge thereof to contact a beam lead resulting in the beam lead being broken. In such cases, it may be desirable to practice a modified embodiment of this invention as described hereinafter. in connection with FIGS. 4A-4D. The procedure described provides an incontact non-removable release layer of a flexible organic material on the streets 20 of a wafer to subsequently serve as an energy absorber when the dice are subsequently broken apart.

Figure 4A:
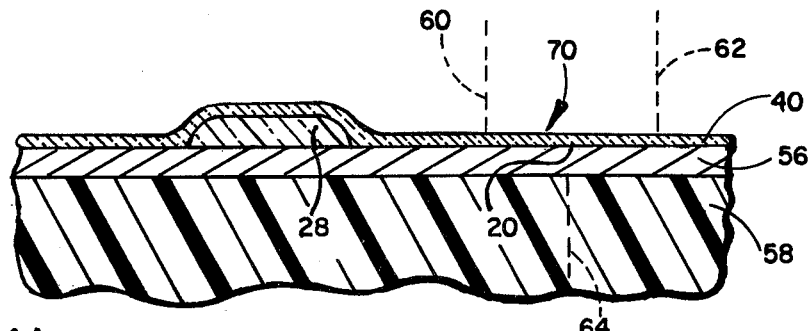
FIGS. 4A-4D are schematic process diagrams showing, in sectional views, the steps of providing an energy absorbing cushion for reducing damage to beam leads when a wafer is broken into individual chips.

FIG. 4A shows a partial cross-sectional view of a wafer having a substrate 58 of sapphire on which a film 56 of silicon has been deposited. Microelectronic circuitry (not shown) is pre-fabricated in the silicon film 56 except in the streets 20 between adjacent microelectronic circuit dice having edges which are indicated in FIG. 4A by vertical dashed lines 60 and 62. External connection to the circuitry will eventually be made through the metallized contact pads 28. In this embodiment of the subject invention, the entire wafer, including the metallized contact pads 28, is initially covered by a protective layer 40 such as was discussed above in connection with FIG. 3A. A vertical dashed line 64, intermediate the die edges 60 and 62, indicates the nominal location for subsequent scribing.

The in-contact, non-removable release layer 66 of a flexible organic material may be formed of a polymerizable resin such as a polyimide, an elastomer such as a silicone, a fluorocarbon such as the resin sold under the trademark Teflon, or the like. Of these materials, the use of a polyimide is preferred.

Figure 4B:
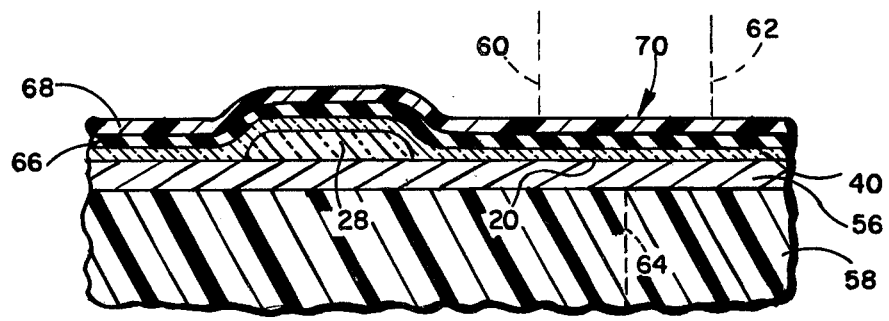

First, a varnish comprising polyimide in an appropriate solvent is applied to the top surface of the wafer. As shown in FIG. 4B, the varnish is formed into a thin uniform layer 66 in the same manner as photoresist layers are commonly formed, i.e., by well-known spinning techniques. The layer of varnish 66 is then cured at a temperature which is below the temperature of polymerization of the resin. For polyimide, a curing temperature of about 100° C is used to remove a sufficient amount of the aforementioned solvent from the varnish. Next, a layer of positive photoresist 68 is applied on top of the layer of resin. The photoresist 68 is processed in the conventional manner to form a photomask over the layer of resin 66 in the regions 70 over the streets 20 between adjacent dice on the wafer as between the edges 60 and 62 of the adjacent dice shown in FIG. 4B. Then, using a standard positive photoresist developer which reacts with both the photoresist and the varnish, the layer of photoresist 68 and the layer of varnish 66 are removed in a single etching step everywhere on the wafer except the regions 70. The resulting configuration is illustrated in FIG. 4C.

Photoresist developers for positive photoresists commonly contain sodium hydroxide which attacks aluminum and which can contaminate MOS circuit elements. However, the use of such a developer is desirable here to etch both the resin and the photoresist simultaneously. It is because of these factors that the practice of this embodiment of the subject invention has been shown and described as starting with a wafer in which that portion of the protective layer 40 which lies over the contact pad windows 42 (see FIGS. 3A-3D) and the contact pads 28 is initially intact and continuous with the remainder of the protective layer 40. Of course, for the cases where the contact pads 28 are of gold or the circuitry is of a type not susceptible to contamination by alkaline photoresist developers, the layer of resin 66 may be formed on the streets 20 substantially as set forth above with the exception that the contact pad windows 42 may be initially exposed as shown in FIG. 3A.

To complete the formation of the in-contact non-removable release layer, viz, the layer of varnish 66 remaining on the streets 20, the resin is then cured to polymerize it at the highest allowable cure temperature compatible with the properties of the circuitry. The resin will then be resistant to subsequent processing using acidic etchants. For MOS circuitry and polyimide resin, curing temperatures between 200° C and 400° C are preferred. The remaining photomask portion of the layer of photoresist 68 is then removed using a standard photoresist stripping solution.

Figure 4C:
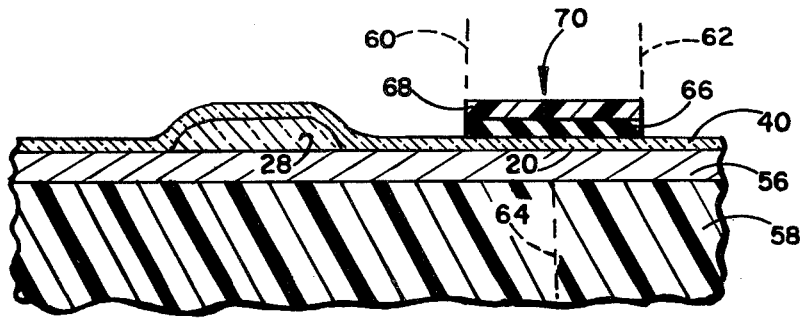

For the case which has been illustrated in FIGS. 4A-4C, viz, wherein the contact pad windows 42 are initially covered by protective layer 40, the contact pad windows 42 are next uncovered by standard semiconductor photolithographic processing. A photomask (not shown) delineating the contact pad windows 42 and protecting the remainder of the surface of the wafer is formed. The portion of the layer of protective material 40 covering the contact pad windows 42 is then removed with a standard buffered fluoride solution. The photomask is then removed with standard stripping solution. The resulting configuration is illustrated in FIG. 4D.

Figure 4D:
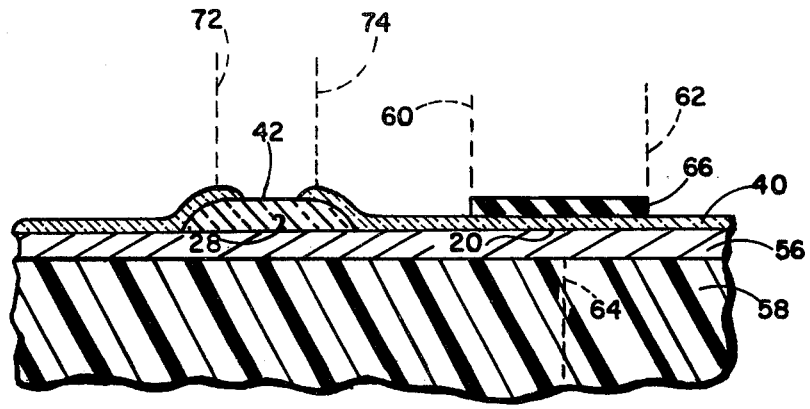

It should be noted that the thickness of the cushion formed as the in-contact non-removable release layer 66, as shown in FIG. 4D, should be on the order of 0.2 to 0.5 mils thick.

In a modification of the embodiment of the invention described immediately above, the in-contact non-removable release layer of organic material 66 is extended to cover the entire wafer except the contact pad windows 42 between the dashed lines 72 and 74 in FIG. 4D. The contact pad windows 42 must be made accessible for subsequent beam lead formation. In this modification, the release layer 66, preferably of polyimide as before, is formed in the same manner as set forth above. However, only that portion of the resin directly over the contact pad windows 42 is etched away. In addition to providing an energy absorbing cushion in the streets 20, this modification provides an etch resistant protective layer which supplements the previously described function of the protective layer 40 of silicon oxide or silicon oxide and silicon nitride. In particular, the polymerized polyimide will help seal the wafer from the etching solutions and solvents used subsequently in practicing the subject invention.

While the invention has been described with reference to certain preferred embodiments thereof, it will be understood by those skilled in the art that various changes in details may be made therein without departing from the spirit and scope of the invention as set out in the following claims. Furthermore, it will be understood by those skilled in the art that references to a metal generally or to a particular metal in the claims includes alloys of that metal with relatively small quantities of other elements added thereto for a beneficial purpose.

What is claimed is:

1. A method of forming beam leads for a plurality of electronic devices fabricated on a wafer, the electronic devices having contact pads of a metal, said method comprising:

depositing a relatively thin layer of a removable release material on said wafer wherein said removable release material is susceptible to etching by etchants which do not react significantly with said metal;

selectively masking and etching said relatively thin layer of a removable release material to remove said release material from said contact pads;

depositing a relatively thick layer of said metal on said relatively thin layer of a removable release material and on said contact pads;

selectively masking and etching said relatively thick layer of said metal to form interdigitated beam leads for said electronic devices; and removing the remainder of said removable release material from said wafer.

2. The method set forth in claim 1 wherein said metal is aluminum.

3. The method set forth in claim 1 wherein said metal is gold.

4. The method set forth in claim 1 wherein said removable release material is selected from the group consisting of copper, magnesium, zinc and titanium.

5. The method set forth in claim 2 wherein the step of depositing said relatively thick layer of aluminum is accomplished by evaporating said aluminum in a vacuum chamber in a manner which produces a relatively high rate of deposition of said aluminum essentially free of aluminum oxide.

6. The method set forth in claim 1 wherein said wafer has first and second opposing sides, wherein said electronic devices are fabricated on said first side of said wafer and wherein said electronic devices have boundaries spaced apart from each other leaving street regions free of usable circuitry between said boundaries, said method comprising scribing said wafer on the second side thereof to a depth of about ninety percent to ninety-five percent of the thickness of said wafer in the street regions thereof.

7. The method set forth in claim 1 wherein said electronic devices have boundaries spaced apart from each other leaving street regions free of usable circuitry between said boundaries and wherein, prior to the step of depositing said relatively thin layer of a removable release material, said method comprises:
- depositing a relatively thin layer of a flexible organic material on said wafer;
- selectively masking and etching said layer of flexible organic material to form a pattern thereof on the street regions of said wafer; and
- curing said flexible organic material to form an energy absorbing cushion resistant to etchants.

8. The method set forth in claim 7 wherein said flexible organic material is selected from the group consisting of polymerizable resins, elastomers and fluorocarbons.

9. The method set forth in claim 8 wherein said flexible organic material is polyimide.

10. The method set forth in claim 1 wherein, prior to the step of depositing said relatively thin layer of a removable release material, said method comprises:
- depositing a relatively thin layer of a flexible organic material on said wafer;
- selectively masking and etching said layer of flexible organic material to remove said flexible organic material from above said contact pads; and
- curing said flexible organic material to cause it to be resistant to etchants.

11. The method set forth in claim 10 wherein said flexible organic material is selected from the group consisting of polymerizable resins, elastomers and fluorocarbons.

12. The method set forth in claim 11 wherein said flexible organic material is polyimide.

* * * * *